(12) United States Patent
Kano

(10) Patent No.: US 6,188,083 B1
(45) Date of Patent: *Feb. 13, 2001

(54) DIODES WITH QUANTUM-WAVE INTERFERENCE LAYERS

(75) Inventor: Hiroyuki Kano, Aichi-ken (JP)

(73) Assignee: Canare Electric Co., Ltd., Aichi-gun (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

This patent is subject to a terminal disclaimer.

(21) Appl. No.: 09/064,222

(22) Filed: Apr. 22, 1998

(30) Foreign Application Priority Data

Apr. 25, 1997 (JP) .................................... 9/123483

(51) Int. Cl.⁷ ..................................... H01L 29/06

(52) U.S. Cl. .............................. 257/17; 257/21; 257/186; 257/438

(58) Field of Search .................................. 257/21, 15, 17, 257/458, 12, 9, 14, 22, 186, 199, 431, 438, 464, 481

(56) References Cited

U.S. PATENT DOCUMENTS

| | | | |
|---|---|---|---|
| 4,985,737 | * 1/1991 | Gaylord et al. | 357/4 |
| 5,091,756 | * 2/1992 | Iga et al. | 357/4 |
| 5,289,486 | * 2/1994 | Iga et al. | 372/45 |
| 5,311,009 | * 5/1994 | Capasso et al. | 250/214 |
| 5,324,959 | * 6/1994 | Nakamura et al. | 257/17 |
| 5,362,974 | * 11/1994 | Irikawa et al. | 257/15 |
| 5,426,312 | * 6/1995 | Whitehead | 257/21 |
| 5,471,068 | * 11/1995 | Tsuji et al. | 257/21 |
| 5,689,357 | * 11/1997 | Campi | 359/245 |
| 5,737,350 | * 4/1998 | Motoda et al. | 372/45 |
| 5,789,760 | * 8/1998 | Irikawa et al. | 257/15 |

FOREIGN PATENT DOCUMENTS 0 497 279 A1 * 8/1992 (EP) .................................... 257/17

OTHER PUBLICATIONS

Takeshi Takagi, et al., Tokyo Institute of Technology, OQE91–13, pp. 73 to 78, "Design of Multi–Quantum Barrier (MQB) and Experimental Verification of MQB Effect" (with English Abstract).

Akihiko Kikuchi, et al., Faculty of Science and Technology Sophia University, ED91–3, pp. 15 to 21, "Design of AlGaInP Multi–Quantum–Barrier" (with English Abstract).

(List continued on next page.)

Primary Examiner—Jerome Jackson, Jr.
Assistant Examiner—Brad Baumeister
(74) Attorney, Agent, or Firm—Oblon, Spivak, McClelland, Maier & Neustadt, P.C.

(57) ABSTRACT

A pin diode, having a p-layer, an n-layer, and an i-layer sandwiched by the p-layer and the n-layer, is constituted by a quantum-wave interference unit with a plurality of pairs of a first layer W and a second layer B. The second layer B has a wider band gap than the first layer W. Each thickness of the first layer W and the second layer b is determined by multiplying by odd number one fourth of quantum-wave wavelength of carriers in each of the first layer W and the second layer B. A δ layer sharply varying in band gap energy from the first and second layers is formed at every interface between the first layer W and the second layer B and has a thickness substantially thinner than the first layer W and the second layer B. A plurality of quantum-wave interference units are formed sandwiching carrier accumulation layers in series. Then, the I-V characteristic of the diode indicates that, for values of an applied backward voltage, a backward electric current can flow rapidly.

5 Claims, 10 Drawing Sheets

OTHER PUBLICATIONS

Takeshi Takagi, et al., Japanese Journal of Applied Physics, vol. 29, No. 11, pp. L 1977 to L 1980, "Potential Barrier Height Analysis of AlGaInP Multi–Quantum Barrier (MQB)", Nov. 1990.

Singh, Semiconductor Optoelectronics Physics and Technology, Chapter 2.9, Prop[erties of Semiconductor Electronics, Bandstructure Modification;l pp. 82–87, 1995.*

Takagi et al., Design of Multi–quantum Barrier (MQB) and Experimental Verification of MQB Effect, Tokyo Insatitute of Technology, OQE91–13 pp. 73–78, 1991.*

U.S. Pat. application 09/059,374, Apr. 14, 1998.*

* cited by examiner

DIODES WITH QUANTUM-WAVE INTERFERENCE LAYERS

BACKGROUND OF THE INVENTION

1. Field of the Invention

The present invention relates to a pin diode having a new structure.

2. Description of the Related Art

Pin diodes having the same characteristic of rectification as pn diodes are known. Also known are avalanche diodes, Zener diodes, and Impact Avalanche Transit Time (IMPATT) diodes used by applying a backward voltage.

However, the I-V characteristics of these diodes have a problem in that they are difficult to change because they are determined by the semiconductor materials constituting the diodes. Therefore, further improvement is required.

SUMMARY OF THE INVENTION

It is therefore an object of the present invention to change the I-V characteristics when the backward voltage is applied to the pin diode.

The first aspect of the present invention is a diode constituted by a p-layer, an n-layer, and an i-layer sandwiched by the two layers and having a plurality of pairs of a first layer and a second layer, the second layer having a wider band gap than the first layer; wherein the thicknesses of the first and second layers are determined by multiplying by an odd number one fourth of the quantum-wave wavelength of carriers of at least one of electrons or holes, in each of the first and the second layers, injected into the i-layer.

The second aspect of the present invention is to set a kinetic energy of the carriers, which determines the quantum-wave wavelength, near the bottom of a conduction band when the carriers are electrons or near the bottom of a valence band in the second layer when the carriers are holes.

The third aspect of the present invention is a diode having a light receiver in a p-layer or an n-layer, which generates carriers injected into an i-layer.

The fourth aspect of the present invention is to form a δ layer between the first layer and the second layer, which sharply varies in band gap energy from the first and second layers and has a thickness substantially thinner than that of the first and the second layers.

The fifth aspect of the present invention is to define each thickness of the first and the second layers as follows:

$$D_W = n_W \lambda_W/4 = n_W h/4[2m_W(E+V)]^{1/2} \quad (1)$$

and $$D_B = n\lambda_B/4 = n_B h/4(2m_B E)^{1/2} \quad (2)$$

In Eqs. 1 and 2, h, $m_W$, $m_B$, E, V, and $n_W$, $n_B$ represent Plank's constant, the effective mass of the minority carriers injected into the first layer, the effective mass of the minority carriers in the second layer, the kinetic energy of the minority carriers injected into the second layer, being at the lowest energy level around the second layer, the potential energy of the second layer relative to the first layer, and odd numbers, respectively.

The sixth aspect of the present invention is to form a plurality of quantum-wave interference units in an i-layer in series, in series, each unit having a plurality of pairs of first and second layers.

The seventh aspect of the present invention is to form a carrier accumulation layer at interfaces of the quantum-wave interference units.

The diode having a structure of the present invention enables to vary the voltage at which electric current flows rapidly, and to change I-V characteristics in a step at several points. Further, the diode of the present invention can be used as a light-detecting diode.

(first, second and fifth aspects of the invention)

The principle of the quantum-wave interference layer of the present invention is explained hereinafter. FIG. 1A shows a conduction band of a quantum-wave interference layer formed in an i-layer. Electrons, or minority carriers, are injected into the i-layer, or conduct from left to right as shown by an arrow in FIGS. 1A and 1B. Among the electrons, those that exist near the bottom of the conduction band of the second layer B are likely to contribute to conduction. The electrons near the bottom of the conduction band of the second layer B have a kinetic energy E. Accordingly, the electrons in the first layer W have a kinetic energy E+V and are thus accelerated by the potential energy V due to the band gap difference between the first layer W and the second layer B. In other words, electrons that move from the first layer W to the second layer B are decelerated by the potential energy V and return to their original kinetic energy E in the second layer B. As explained above, the kinetic energy of electrons in the conduction band is modulated by the potential energy due to the multi-layer structure.

When the thicknesses of the first layer W and the second layer B are on the order of the quantum-wave wavelength, electrons tend to have characteristics of a wave. The wave length of the electron quantum-wave is calculated by Eqs. 1 and 2 using the kinetic energy of the electron. Further, defining the respective wave number vector of the first layer W and the second layer B as $K_W$ and $K_B$, reflectivity R of the wave is calculated by:

$$R = (|K_W| - |K_B|)/(|K_W| + |K_B|) \quad (3)$$

$$= ([m_W(E+V)]^{1/2} - [m_B E]^{1/2})/([m_W(E+V)]^{1/2} + [m_B E]^{1/2})$$

$$= [1 - (m_B E/m_W(E+V))^{1/2}]/[1 + (m_B E/m_W(E+V))^{1/2}].$$

Further, when $m_B = m_W$, the reflectivity R is calculated by:

$$R = [1-(E/(E+V))^{1/2}]/[1+(E/(E+V))^{1/2}] \quad (4).$$

When E/(E+V)=x, Eq. 4 is transformed into:

$$R = (1-x^{1/2})/(1+x^{1/2}) \quad (5).$$

The characteristic of the reflectivity R with respect to the energy ratio x obtained by Eq. 5 is shown in FIG. 2.

When the second layer B and the first layer W have S periods, the reflectivity $R_S$ on the incident face of a quantum-wave is calculated by:

$$R_S = [(1-x^S)/(1+x^S)]^2 \quad (6).$$

When the condition $x \leq 1/10$ is satisfied, $R \geq 0.52$. Accordingly, the relation between E and V is satisfied with:

$$E \leq V/9 \quad (7).$$

Since the kinetic energy E of the conducting electrons in the second layer B exists near the bottom of the conduction band, the relation of Eq. 7 is satisfied and the reflectivity R at the interface between the second layer B and the first layer W becomes 52% or more. Consequently, the multi-layer structure having two kinds of layers with band gaps different from each other enables effective quantum-wave reflection of electrons injected into the i-layer.

Further, utilizing the energy ratio x enables the thickness ratio $D_B/D_W$ of the second layer B to the first layer W to be obtained by:

$$D_B/D_W = [m_W/(m_B x)]^{1/2} \qquad (8).$$

As shown in FIG. 1B, when the backward voltage is applied to a diode having quantum-wave interference layer in the i-layer, the energy level of the quantum-wave interference layer band is inclined by the external voltage. Then E+V and E, or kinetic energy of the electrons in the first layer W and the second layer B respectively, increase according to a proceeding of quantum-wave. Accordingly, the thicknesses of the first layer W and the second layer B no longer improve the quantum-wave reflectivity of the electrons injected into the i-layer. Consequently, in the range of applied voltage for which the kinetic energy of electrons does not exceed the energy level used to design the thickness of the quantum-wave interference layer, the electrons are reflected and do not cause electric current. But when the applied voltage increases to the degree that the kinetic energy of the electrons injected into the i-layer exceeds the energy level used to design the thicknesses of the quantum-wave interference layer, reflected electrons begin to flow rapidly. Consequently, I-V characteristic of the diode varies rapidly. In short, the dynamic resistance of the diode drops.

The thicknesses of the first layer W and the second layer B are determined for selectively reflecting either the holes or the electrons, because of the difference in potential energy between the valence and the conduction bands, and the difference in effective mass of holes and electrons in the first layer W and the second layer B. In other words, the optimum thickness for reflecting electrons is not the optimum thickness for reflecting holes. Equations 3–8 refer to a structure of the quantum-wave interference layer for selectively reflecting electrons. The thickness for selectively reflecting electrons is designed based on the difference in the potential energy of the conduction band and on the effective mass of electrons. Further, the thickness for selectively reflecting holes is designed based on the difference in the potential energy of the valence band and on the effective mass of holes, forming another type of quantum-wave interference layer in an i-layer for reflecting only holes and allowing electrons to pass through.

Forming the quantum-wave interference layers of electrons and holes in an i-layer as described above enable I-V characteristic of the diode to vary rapidly and the dynamic resistance of the diode to be lowered sharply.
(third aspect of the invention)

The diode of the present invention can be used as a photodiode, or a light detector, by forming a light receiver, which generates carriers to be injected into an i-layer, in a p-layer or an n-layer.
(fourth aspect of the invention)

The fourth aspect of the present invention is to form a δ layer at the interface between the first layer W and the second layer B. The δ layer has a thickness substantially thinner than both of the first layer W and the second layer B and sharply varies the energy band profile of the diode. The reflectivity R of the interface is determined by Eq. 5. By forming the δ layer, the potential energy V of an energy band becomes larger and the value x of Eq. 5 becomes smaller. Accordingly, the reflectivity R becomes larger.

Variations are shown in FIGS. 5A to 5C. The δ layer may be formed on both ends of every first layer W as shown in FIGS. 5A to 5C. In FIG. 5A, the δ layers are formed so that an energy level higher than that of the second layer B may be formed. In FIG. 5B, the δ layers are formed so that an energy level lower than that of the first layer W may be formed. In FIG. 5C, the δ layers are formed so that a band higher than that of the second layer B and a band bottom lower than that of the first layer W may be formed. As an alternative to each of the variations shown in FIGS. 5A to 5C, the δ layer can be formed on one end of every first layer W.

Forming one δ layer realizes large reflectivity of the quantum-wave at the interface between the first layer W and the second layer B and a plurality of the δ layers realizes larger reflectivity as a whole.
(sixth and seventh aspects of the invention)

The I-V characteristic of the diode in the present invention can be varied in a step at various points by forming quantum-wave interference units having a plurality of multi-layer structures, in series and at certain intervals, or forming a carrier accumulation layer between the respective quantum-wave interference units.

BRIEF DESCRIPTION OF THE DRAWING

Other objects, features, and characteristics of the present invention will become apparent upon consideration of the following description and the appended claims with reference to the accompanying drawings, all of which form a part of the specification, and wherein reference numerals designate corresponding parts in the various figures, wherein;

DETAILED DESCRIPTION OF THE PREFERRED EMBODIMENT

The invention will be more fully understood by reference to the following examples.

Example 1

Figure 1A:
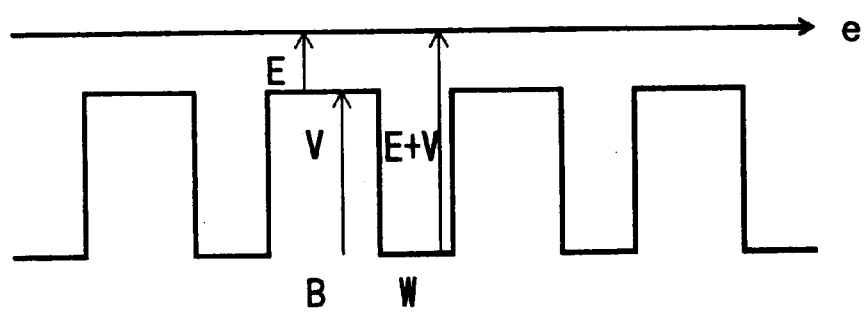
FIGS. 1A and 1B are explanatory views of a conduction band of a multi-layer structure according to the first, the second and the fifth aspects of the present invention.
Figure 1B:
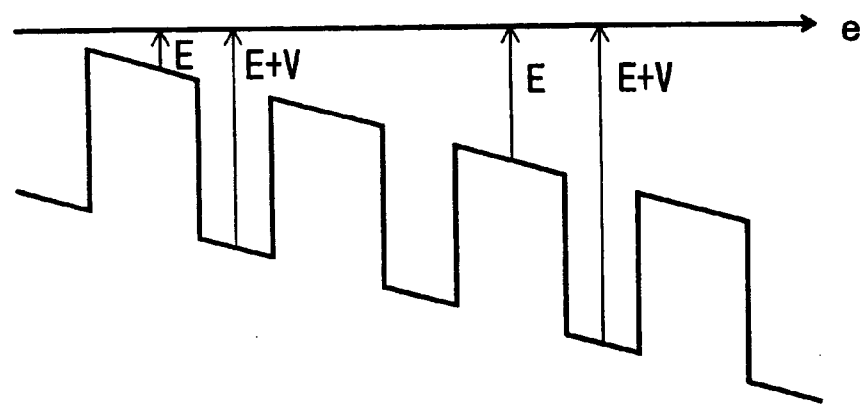
Figure 2:
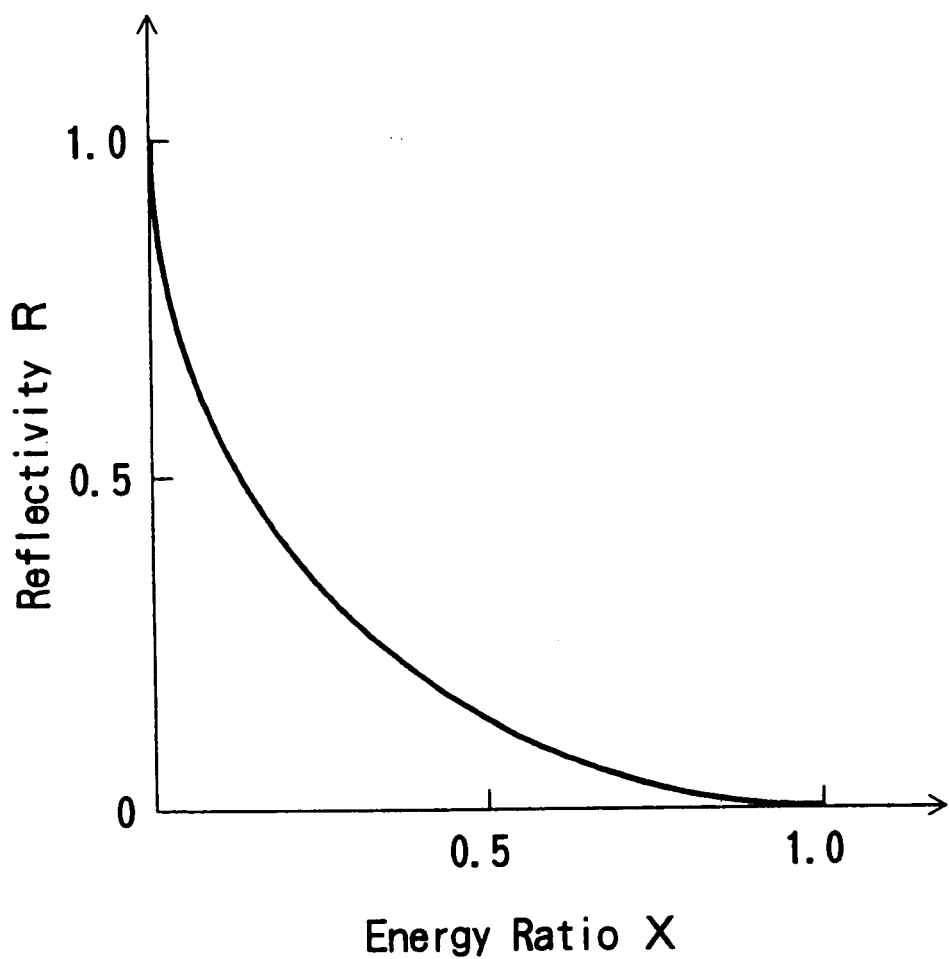
FIG. 2 is a graph showing a relation between an energy ratio x and a reflectivity R.
Figure 3:
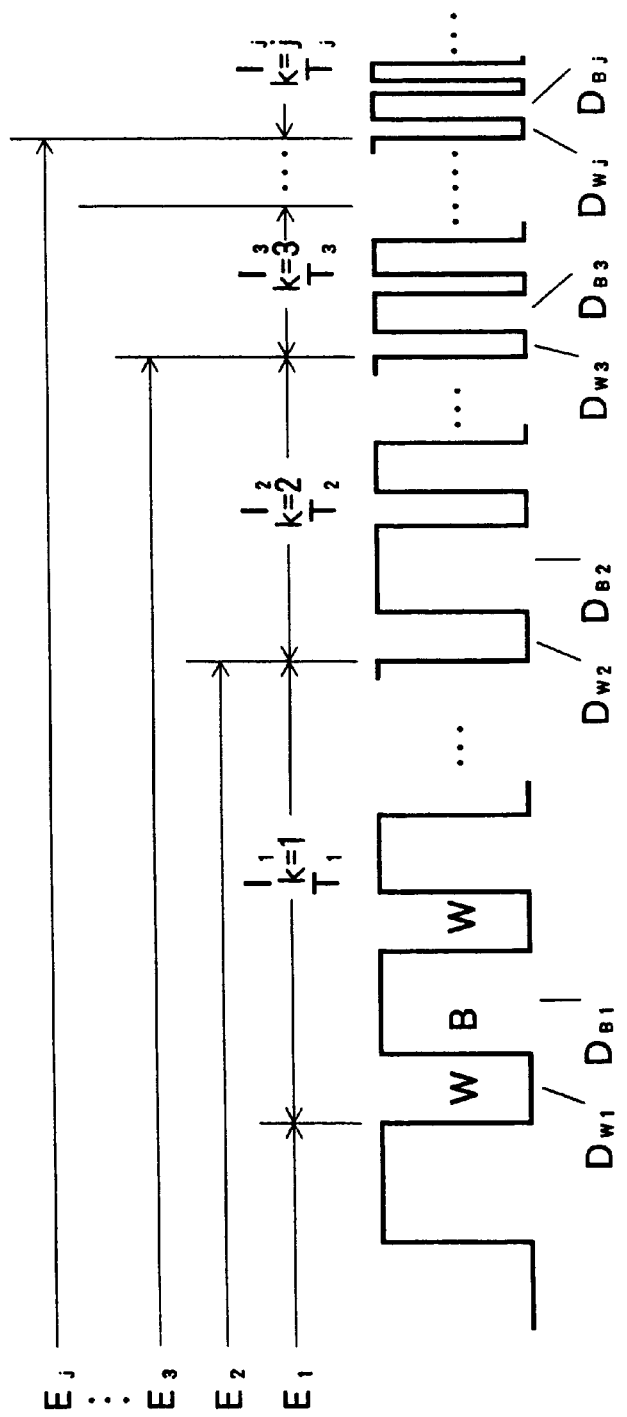
FIG. 3 is an explanatory view of the partial quantum-wave interference layers $I_k$ according to the first, second and fifth aspects of the present invention.
Figure 4:
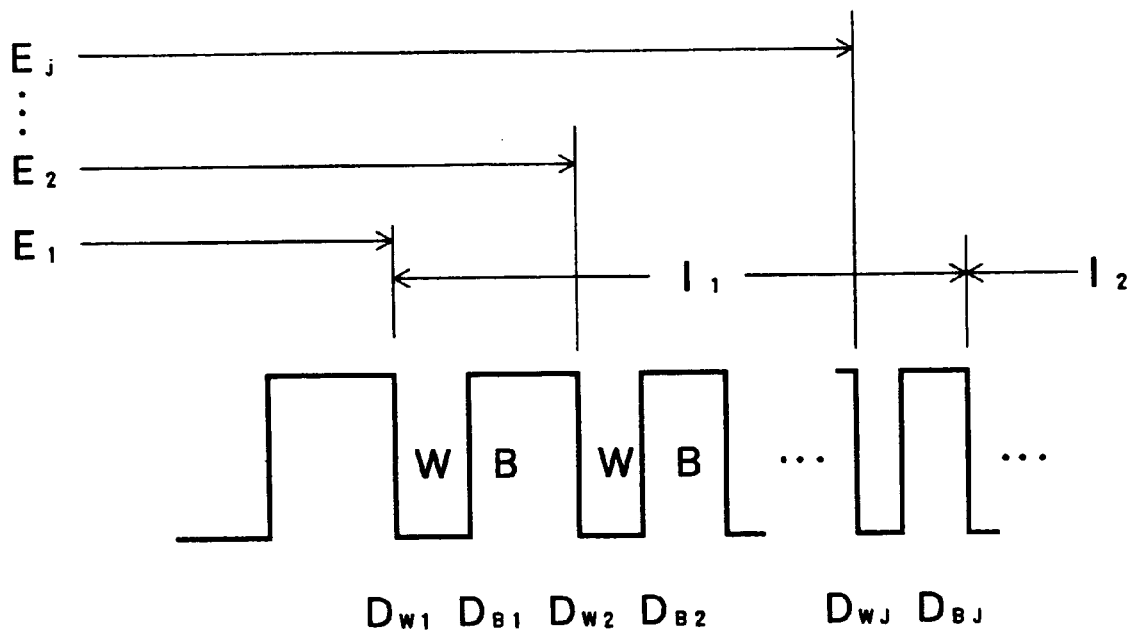
FIG. 4 is an explanatory view of the partial quantum-wave interference layers $I_k$ according to the first, second and fifth aspects of the present invention.
Figure 5A:
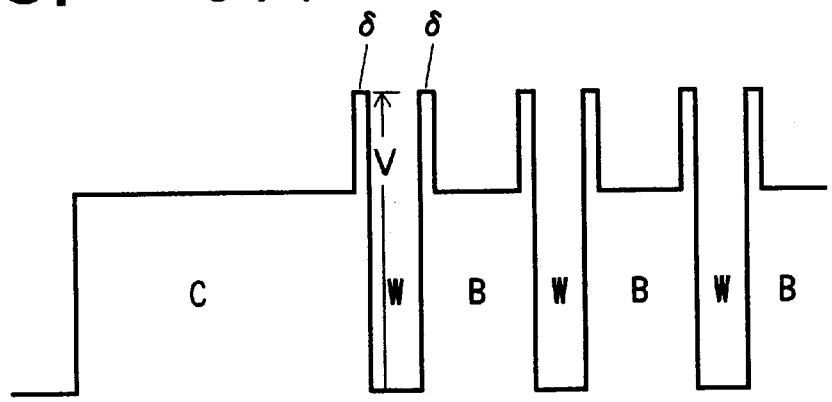
FIGS. 5A–5C are explanatory views of δ layers according to the fourth aspect of the present invention.
Figure 5B:
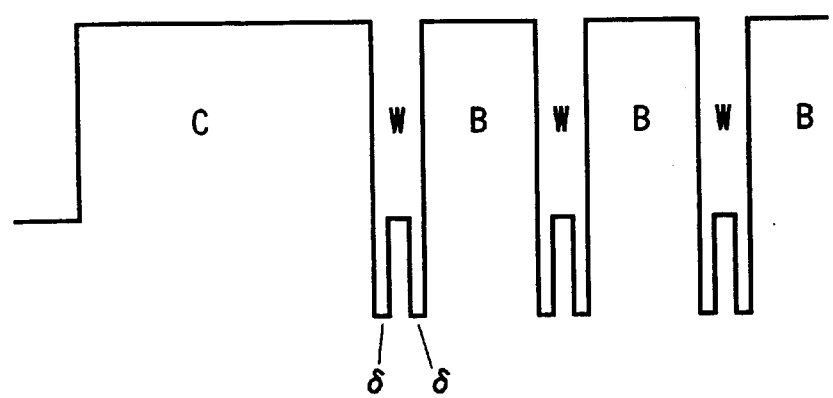
Figure 5C:
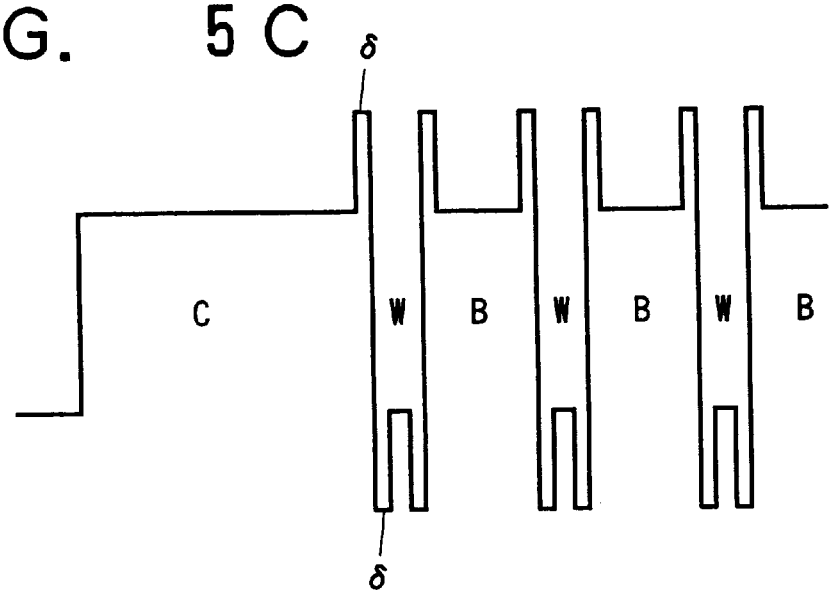
Figure 6:
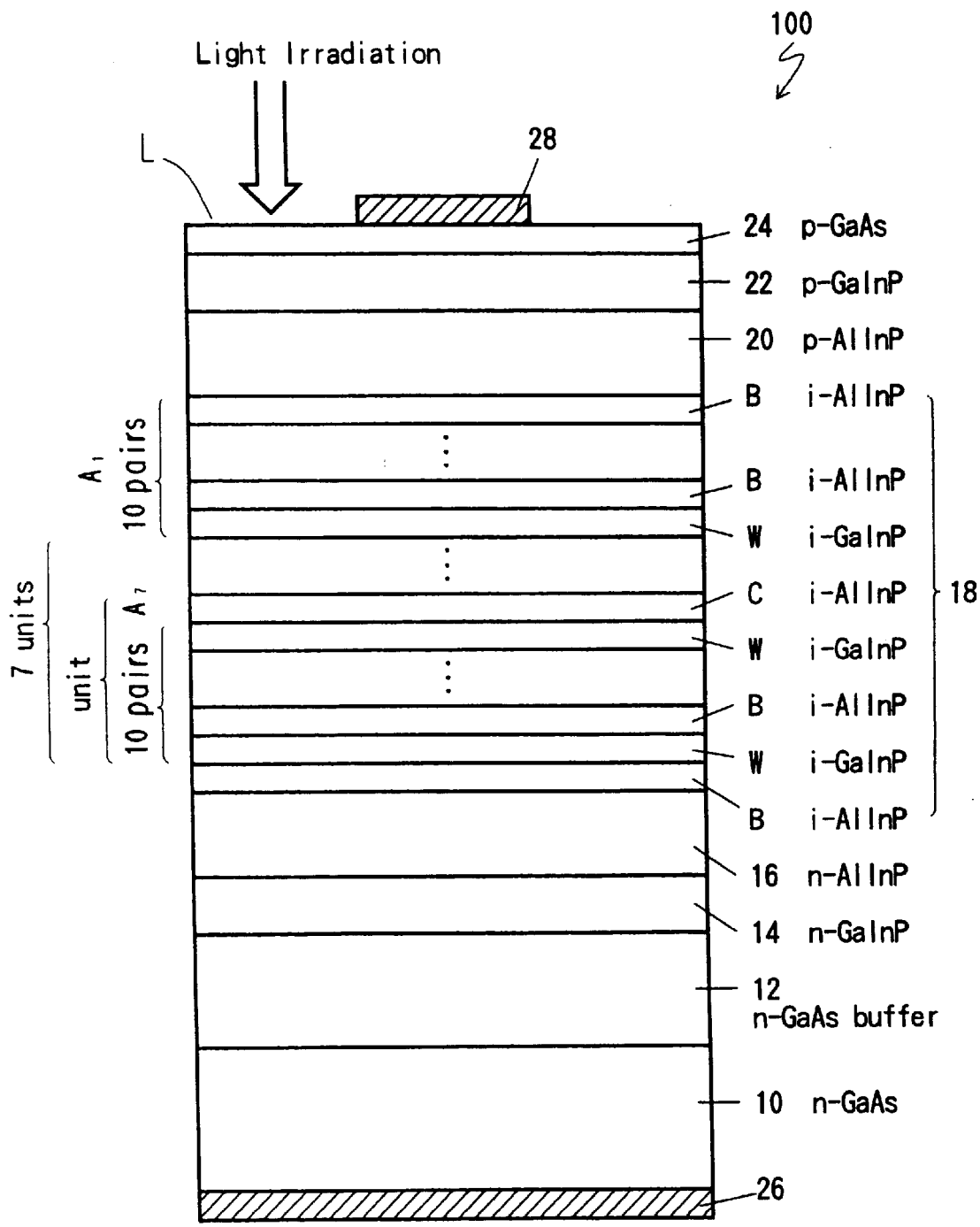
FIG. 6 is a sectional view showing a exemplary structure of a pin diode (Example 1)

FIG. 6 is a sectional view of a pin diode 100 in which a quantum-wave interference layer is formed in a i-layer. The pin diode 100 has a substrate 10 made of gallium arsenide (GaAs). A GaAs buffer layer 12 of n-type conduction, having a thickness generally of 0.3 μm and an electron concentration of $2\times10^{18}/cm^3$, is formed on the substrate 10. An n-$Ga_{0.51}In_{0.49}P$ contact layer 14 of n-type conduction, having a thickness generally of 0.13 μm and electron concentration of $2\times10^{18}/cm^3$, is formed on the buffer layer 12. An n-$Al_{0.51}In_{0.49}P$ n-layer 16, having a thickness generally of 1.2 μm and an electron concentration of $1\times10^{18}/cm^3$, is formed on the contact layer 14. A non-doped i-layer 18 is formed on the n-layer 16. An $Al_{0.51}In_{0.49}P$ p-layer 20, having a thickness generally of 0.2 μm and hole concentration of $1\times10^{18}/cm^3$, is formed on the i-layer 18. A p-$Ga_{0.51}In_{0.49}P$ contact layer 22 of p-type conduction, having a thickness generally of 0.13 μm and a hole concentration of $2\times10^{18}/cm^3$, is formed on the p-layer 20. A p-GaAs first contact layer 24 of p-type conduction, having a thickness generally of 0.06 μM and a hole concentration of $2\times10^{18}/cm3$, is formed on the contact layer 22. An electrode layer 26 made of gold and germanium (Au/Ge), having a thickness generally of 0.2 μm, is formed covering the entire back of the substrate 10. Another electrode layer 28 made of gold and zinc (Au/Zn), having a thickness generally of 0.2 μm, is formed on some portion of the first p-type contact layer 26.

A quantum-wave interference unit $A_1$ having a multi-quantum layer structure with 10 pairs of a non-doped $Ga_{0.51}In_{0.49}P$ first layer W and a non-doped $Al_{0.51}In_{0.49}P$ second layer B is formed in the i-layer 18. $A_2, \ldots, A_7$ are formed like $A_1$, and 7 quantum-wave interference units in total are formed in the i-layer 18.

Figure 7A:
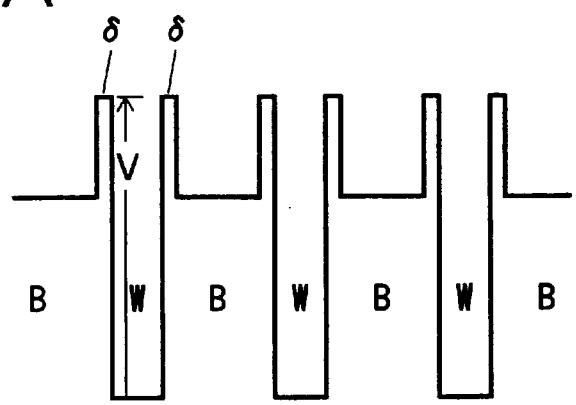
FIGS. 7A–7C are views showing the energy diagrams of the quantum-wave interference layer of the pin diode (Example 1)
Figure 7B:
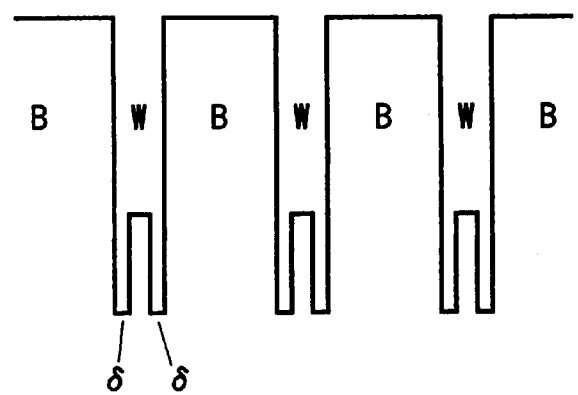
Figure 7C:
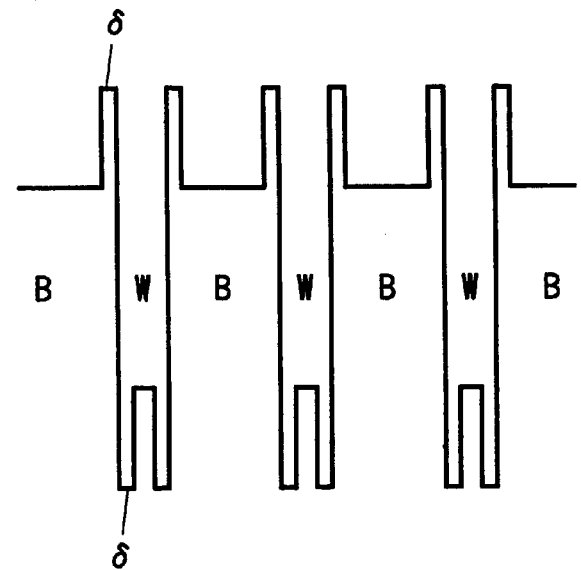

FIGS. 7A to 7C show a structure of the quantum-wave interference layer $A_1$ in detail. The first unit W has a thickness of 5 nm, and the second layer B has a thickness of 7 nm. In FIG. 7A for example, a non-doped δ layer made of $Al_{0.33}Ga_{0.33}In_{0.33}P$ is formed at each interface between the first layer W and the second layer B.

A non-doped $Al_{0.51}In_{0.49}P$ carrier accumulation layer C, having a thickness of 14 nm, is formed between any quantum-wave interference units $A_i$ and $A_{i+1}$, respectively, as shown in FIG. 6. Thicknesses of the first layer W and the second layer B are respectively determined according to Eqs. 1 and 2, on condition that no external voltage is applied thereto.

The second layers B which contact to the p-layer 20 and the n-layer 16 have a thickness of 0.05 μm, respectively. The substrate 10 has a diameter of 2.0 inches and the normal direction of its main surface is offset toward the [011] axis by 15 degree from the (100) plane.

The pin diode 100 was manufactured by gas source molecular beam epitaxial deposition (GS-MBE) which is an epitaxial growth method performed under extremely high vacuum condition. GS-MBE is different from a conventional MBE which supplies group III and V elements both from sources. In GS-MBE, group III elements such as indium (In), gallium (Ga), and aluminum (Al) are supplied from a solid source and group V elements such as arsenic (As) and phosphorus (P) are supplied by heat decomposition of gas material such as $AsH_3$ and $PH_3$.

Figure 8A:
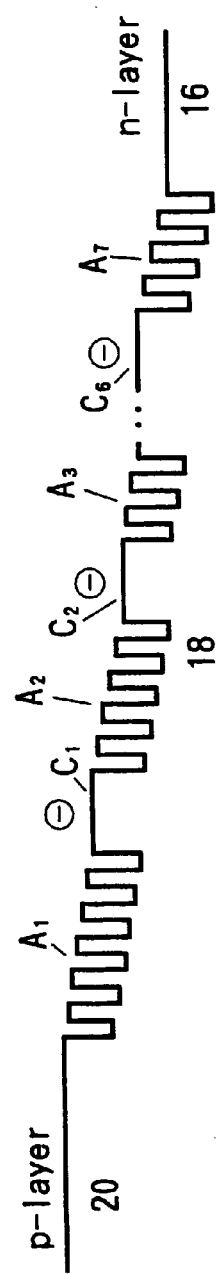
FIGS. 8A and 8B are views showing the energy diagrams of the i-layer of the pin diode when the external backward voltage is applied thereto (Example 1)
Figure 8B:
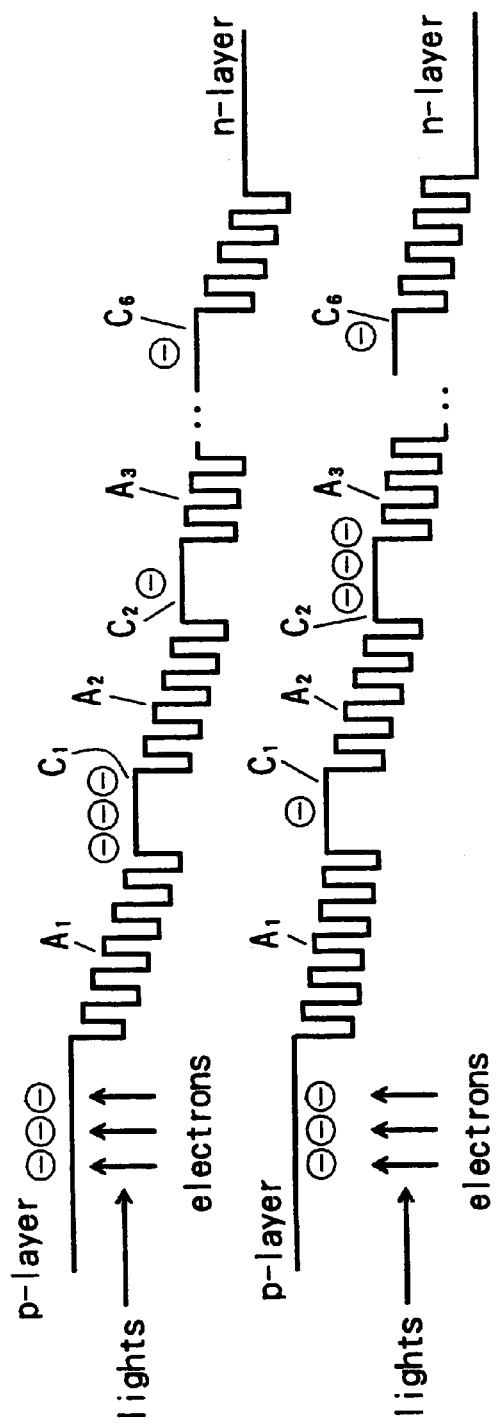

Each quantum-wave interference unit $A_1$ to $A_7$ reflects electrons, which are generated in the p-layer 20 as minority carriers, and electrons are not conducted in the i-layer 18. Although the δ layer is not shown in FIGS. 8A and 8B, it is present at each interface between the first layer W and the second layer B, as shown in FIGS. 7A. FIG. 8A shows an electric potential gradient occurring in the i-layer 18 as an insulation layer on the condition that a backward voltage is applied to the interface between the p-layer 20 and the n-layer 16 of the diode 100. Because of the backward voltage applied to the quantum-wave interference unit $A_1$, its reflectivity of electrons is lowered and minority carriers generated in the p-layer 20 start to flow as a small quantity of leakage current. The minority carriers are conducted in the first quantum-wave interference unit $A_1$, and flows into the first carrier accumulation layer $C_1$. This accumulation of electrons in the accumulation layer $C_1$ makes an electric potential gradient of the quantum-wave interference unit $A_1$ steeper and the quantum-wave interference unit $A_2$ adjacent to $A_1$ gentler. Consequently, the kinetic energy of electrons injected into the quantum-wave interference unit $A_1$ becomes larger than that used to design each thickness of the respective layers of the quantum-wave interference unit $A_1$. Consequently the reflectivity of the quantum-wave interference unit $A_1$ becomes smaller, and more electrons pass through the quantum-wave interference unit $A_1$ and are accumulated in the carrier accumulation layer $C_1$. Then, the electric potential gradient of the second quantum-wave interference unit $A_2$ becomes gentler, and its reflectivity improves. Electrons are thus accumulated in the carrier accumulation layer $C_1$ effectively.

Then, the same process occurs between the second and the third quantum-wave interference units $A_2$ and $A_3$, and electrons in the carrier accumulation layer $C_1$ leak into an electron accumulation layer $C_2$ by a small quantity. The electric potential gradient of the second quantum-wave interference unit $A_2$ becomes steeper, but, the electric potential gradients of the first and the third quantum-wave interference layers $A_1$ and $A_3$ become gentler. Thus, the reflectivities of the first and the third quantum-wave interference unit improve.

Through the above process, electrons accumulated in the first carrier accumulation layer $C_1$ are propagated to the second carrier accumulation layer $C_2$, then to the other respective carrier accumulation layers in the i-layer 18. Thus accumulated electrons are propagated from the p-layer 20 to the n-layer 16.

Figure 9:
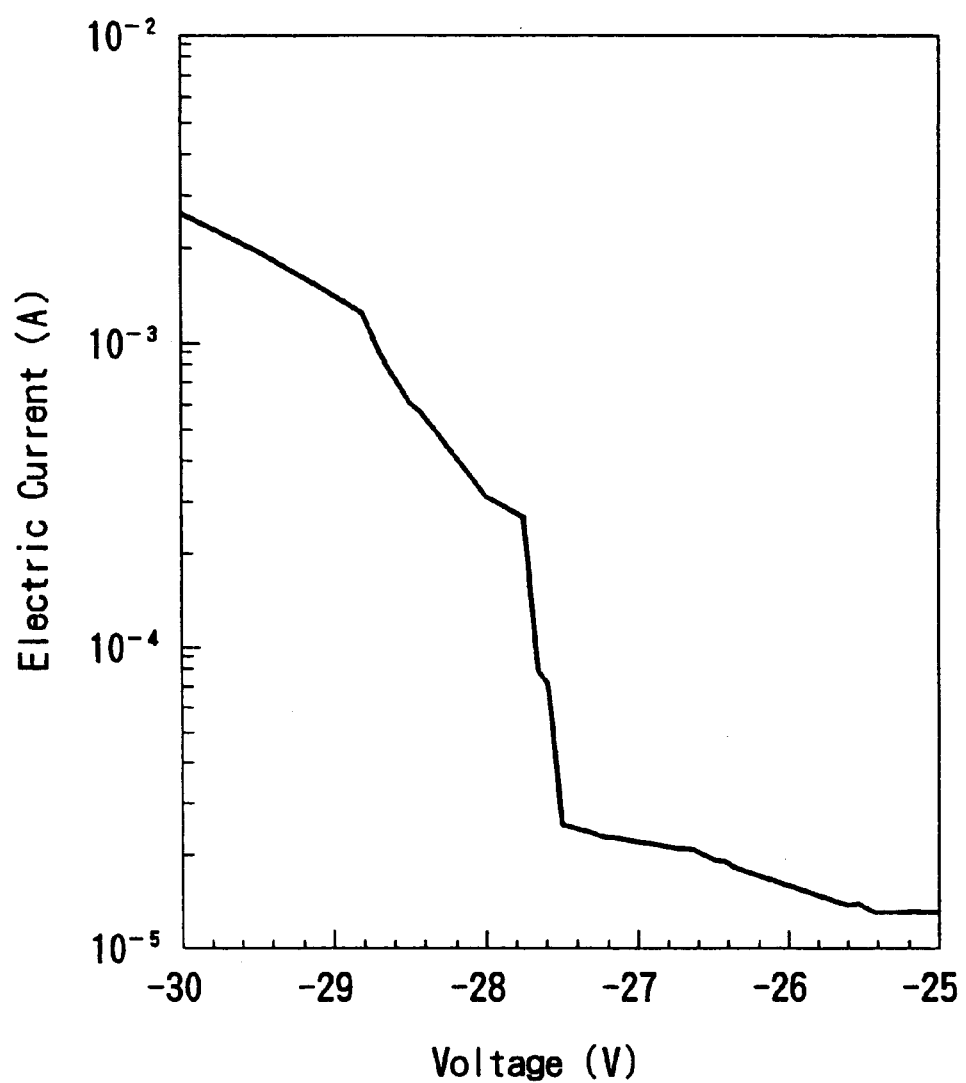
FIG. 9 is a graph showing I-V characteristic of the pin diode when the backward voltage is applied thereto (Example 1)

The I-V characteristic was measured when the backward voltage is applied to the pin diode 100. As shown in FIG. 9, until a backward voltage is 27.6 V, the electric current is substantially small, about $10^{-5}$ A. When the backward voltage is above 27.6 V, the electric current increases sharply, at certain plural voltage values.

Example 2

Figure 10:
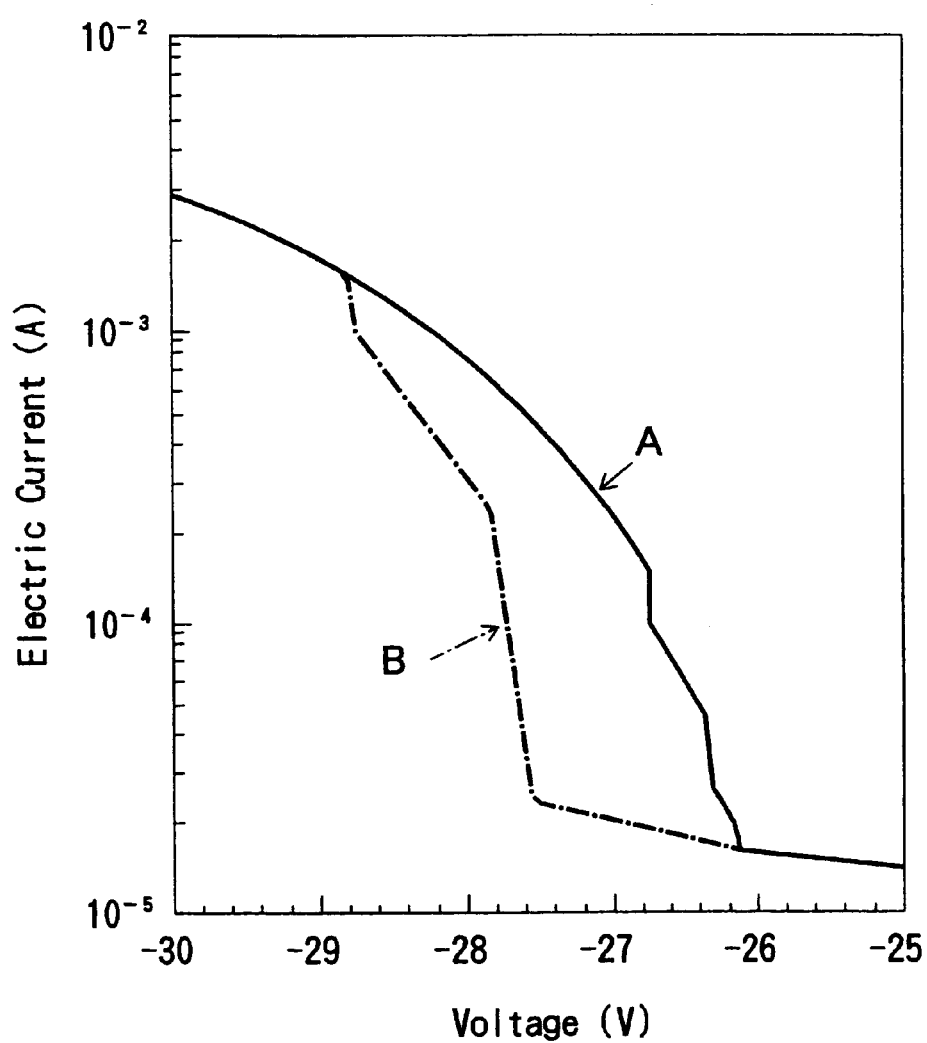
FIG. 10 is a graph showing I-V characteristic of the pin diode when irradiated by light and when the inverse voltage is applied thereto (Example 2).

As shown in FIG. 6, a window L is formed on the surface of the p-layer 24. The p-layer 20 corresponding to the window L functions as a light receiver which receives lights and generates electrons. The I-V characteristic was measured when the backward voltage is applied to the pin diode 100 and the result is shown in FIG. 10. Electrons, light-excited in the p-layer 20, are propagated through the i-layer 18 by a mechanism described above. As shown in FIG. 10, an electric current occurs for a small quantity of a backward voltage because of the electrons generated by light excitation. Also, the electric current increases step by step, at certain plural backward voltages.

As shown in FIG. 10, in the range between -26.2 V and -27.6 V, the electric current when the diode is irradiated by light, represented by A, is tenfold that of a dark current, represented by B. In this range, the electric current obtained when the diode is irradiated by light can be used as a light detector. Advantageously, the operating voltage of the diode is substantially lower compared to that of an avalanche photo diode in the prior art.

In the embodiments, a δ layer is formed in the diode 100. The δ layer improves the reflectivity of the diode 100.

Alternatively, because the reflectivity can be improved by a multipath reflection, the δ layer is not necessarily needed.

In the embodiments, seven quantum-wave interference units $A_1$ to $A_7$ are connected in series, with a carrier accumulation layer C lying between each of the quantum-wave interference units. Alternatively, one quantum-wave interference unit can be made in an i-layer. In Example 1, the quantum-wave interference layer was formed to have a multi-layer structure including $Ga_{0.51}In_{0.49}P$. Alternatively, the quantum-wave interference layer can be made of quaternary compounds such as $Al_xGa_yIn_{1-x-y}P$, selecting arbitrary composition ratio within the range of $0 \leq x \leq 1$, $0 \leq y \leq 1$, and $0 \leq x+y \leq 1$. Further alternatively, the quantum-wave interference unit can be made of group III-V compound semiconductors, group II-VI compound semiconductors, Si and Ge, and semiconductors of other hetero-material.

While the invention has been described in connection with what are presently considered to be the most practical and preferred embodiments, it is to be understood that the invention is not to be limited to the disclosed embodiments, but is intended to cover various modifications and equivalent arrangements included within the spirit and scope of the appended claims.

What is claimed is:

1. A diode comprising:

a p-layer, an n-layer, and an i-layer sandwiched between said p-layer and said n-layer;

wherein said i-layer includes a quantum-wave interference unit having a plurality of pairs of a first layer and a second layer, said second layer having a wider band gap than said first layer;

wherein the thickness of said first layer ($D_W$) is determined by the equation:

$$D_W = n_W \lambda_W / 4,$$

where $n_W$ is an odd number and $\lambda_W$ is a quantum-wave wavelength of carriers injected in the first layer given by the equation:

$$\lambda_W = h/(2\, m_W (E+V))^{1/2},$$

where h is Plank's constant, $m_W$ is the effective mass of said carriers injected in said first layer, V is a difference in carrier potential energy between said second layer and said first layer, E is the kinetic energy of said carriers injected in said second layer without external voltage applied and $E \leq V/9$;

the thickness of said second layer ($D_B$) is determined by the equation:

$$D_B = n_B \lambda_B / 4,$$

where $n_B$ is an odd number and $\lambda_B$ is a quantum-wave wavelength of carriers injected in the second layer given by the equation:

$$\lambda_B = h/(2\, m_B E)^{1/2},$$

where $m_B$ is the effective mass of said carriers injected in said second layer; and the carriers in said first and second layers are selected from the group consisting of electrons and holes.

2. A diode according to claim 1, wherein E is set near the bottom of a conduction band of said second layer when the carriers are electrons and is set near the bottom of a valence band of said second layer when the carriers are holes.

3. A diode according to claim 1, further comprising a light receiving layer located in said p-layer or said n-layer, said light receiving layer being capable of generating the carriers to be injected into said i-layer.

4. A diode according to claim 1, further comprising a δ layer between said first layer and said second layer, said δ layer being thinner than said first layer and said second layer, and having an energy band gap that is different from said first and second layers.

5. A diode comprising:

a p-layer, an n-layer, and an i-layer sandwiched between said p-layer and said n-layer;

wherein said i-layer includes a plurality of quantum-wave interference units in series with a carrier accumulation layer formed between two adjacent quantum-wave interference units, wherein each of said quantum-wave interference units has a plurality of pairs of a first layer and a second layer, said second layer having a wider band gap than said first layer;

wherein the thickness of said first layer ($D_W$) is determined by the equation:

$$D_W = n_W \lambda_W / 4,$$

where $n_W$ is an odd number and $\lambda_W$ is a quantum-wave wavelength of carriers injected in the first layer given by the equation:

$$\lambda_W = h/(2\, m_W (E+V))^{1/2},$$

where h is Plank's constant, $m_W$ is the effective mass of said carriers injected in said first layer, V is a difference in carrier potential energy between said second layer and said first layer, E is the kinetic energy of said carriers injected in said second layer without external voltage applied and $E \leq V/9$;

the thickness of said second layer ($D_B$) is determined by the equation:

$$D_B = n_B \lambda_B / 4,$$

where $n_B$ is an odd number and $\lambda_B$ is a quantum-wave wavelength of carriers injected in the second layer given by the equation:

$$\lambda_B = h/(2\, m_B E)^{1/2},$$

where $m_B$ is the effective mass of said carriers injected in said second layer; and the carriers in said first and second layers are selected from the group consisting of electrons and holes.

* * * * *